(12) United States Patent
Cho et al.

(10) Patent No.: US 8,898,926 B2
(45) Date of Patent: Dec. 2, 2014

(54) SUBSTRATE DRYER USING SUPERCRITICAL FLUID, APPARATUS INCLUDING THE SAME, AND METHOD FOR TREATING SUBSTRATE

(75) Inventors: Jung Keun Cho, Chungcheongnam-do (KR); Kyo-Woog Koo, Chungcheongnam-do (KR)

(73) Assignee: Semes Co. Ltd., Chungcheongnam-do (KR)

( * ) Notice: Subject to any disclaimer, the term of this patent is extended or adjusted under 35 U.S.C. 154(b) by 1860 days.

(21) Appl. No.: 11/809,308

(22) Filed: May 31, 2007

(65) Prior Publication Data

US 2008/0063493 A1    Mar. 13, 2008

(30) Foreign Application Priority Data

Sep. 12, 2006    (KR) .................. 10-2006-0087935

(51) Int. Cl.
*H01L 21/677*    (2006.01)
*F26B 21/14*    (2006.01)
*H01L 21/67*    (2006.01)

(52) U.S. Cl.
CPC .............................. *H01L 21/67034* (2013.01)
USPC ................................ 34/210; 34/217; 414/217

(58) Field of Classification Search
USPC ................ 156/345.31; 118/719; 414/217
See application file for complete search history.

(56) References Cited

U.S. PATENT DOCUMENTS

| 2003/0172954 | A1 | 9/2003 | Verhaverbeke | |
| 2005/0160974 | A1* | 7/2005 | Ivanov et al. | ............. 118/50 |

FOREIGN PATENT DOCUMENTS

| JP | 08-197021 A | 8/1996 | |
| JP | 2001-060575 | * 3/2001 | ............ H01L 21/304 |
| JP | 2003-109933 A | 4/2003 | |
| JP | 2003-282408 | 10/2003 | |
| JP | 2003-282524 | 10/2003 | |
| JP | 2004-207579 A | 7/2004 | |
| JP | 2004-311507 A | 11/2004 | |
| JP | 2005-116759 | 4/2005 | |
| KR | 1020020083462 | 11/2002 | |
| TW | 538472 B | 4/2002 | |

* cited by examiner

*Primary Examiner* — Parviz Hassanzadeh
*Assistant Examiner* — Nathan K Ford
(74) *Attorney, Agent, or Firm* — Jenkins, Wilson, Taylor & Hunt, P.A.

(57) ABSTRACT

The present invention is directed to a substrate dryer, a substrate treating apparatus including the substrate dryer, and a substrate treating method. The substrate dryer includes a chamber, a process chamber constituting one part of the chamber and provided for supplying supercritical fluid to a substrate to dry the substrate, and a high-pressure chamber constituting the other part of the chamber and provided for boosting the process chamber above a critical pressure. According to the present invention, the substrate drying chamber is boosted fast by the high-pressure chamber to change to a supercritical state and thus a substrate dry treatment is performed using supercritical fluid.

8 Claims, 7 Drawing Sheets

SUBSTRATE DRYER USING SUPERCRITICAL FLUID, APPARATUS INCLUDING THE SAME, AND METHOD FOR TREATING SUBSTRATE

CROSS-REFERENCE TO RELATED APPLICATIONS

This U.S. non-provisional patent application claims priority under 35 U.S.C §119 of Korean Patent Application 2006-87935 filed on Sep. 12, 2006, the entirety of which is hereby incorporated by reference.

BACKGROUND

The present invention relates to apparatuses and methods for treating a substrate. More specifically, the present invention is directed to apparatus and method for drying a substrate using supercritical fluid.

Conventionally, a substrate wet-treated with chemicals and deionized water (DI water) is dried by supplying a mixed gas of isopropyl alcohol (IPA) and nitrogen ($N_2$). However, it is difficult to drain DI water supplied to fine patterns formed at a substrate during a substrate drying treatment. Also it is difficult to cope with dry conditions suitable for the kind of materials for the fine patterns. Accordingly, dry treating methods using supercritical fluid have been adopted to effectively dry wet-treated fine patterns.

An example of the dry treating methods using supercritical fluid is disclosed in Japanese Patent Publication No. 08-250464. According to the above-mentioned patent, a dry treating method includes carrying a substrate into a high-pressure container that is a supercritical treating apparatus, performing a series of wet treatments, and introducing liquid carbon dioxide into the high-pressure container to be substituted with alcohol on the surface of the substrate and to raise a temperature. Thus, a state of the carbon dioxide is converted to a supercritical state to perform a supercritical dry treatment and then decompression is conducted.

Unfortunately, the foregoing method encounters stability-related problems such as corrosion caused by treating chemicals because the treating chemicals should be introduced into a high-pressure container. In addition, since a treating apparatus should be durable against high pressure, large-diameter pipes are substantially unusable. For this reason, time required for supplying and draining the treating chemicals is long enough to lower production. Moreover, it is wasteful and impractical to perform a wet treatment (not requiring a high pressure) in the high-pressure container.

SUMMARY OF THE INVENTION

Exemplary embodiments of the present invention are directed a substrate dryer. In an exemplary embodiment, the substrate dryer may include: a chamber; a process chamber constituting one part of the chamber and provided for supplying supercritical fluid to a substrate to dry the substrate; and a high-pressure chamber constituting the other part of the chamber and provided for boosting the process chamber above a critical pressure of the supercritical fluid.

Exemplary embodiments of the present invention are directed to a substrate treating apparatus. In an exemplary embodiment, the substrate treating apparatus may include: a loading unit where a substrate is carried in and out; a substrate cleaning unit configured for cleaning the substrate; a substrate drying unit comprising a process chamber provided for supplying supercritical fluid to the substrate to dry the substrate and a high-pressure chamber provided for fast boosting the substrate drying chamber above a critical pressure of the supercritical fluid; and a substrate transport robot configured for transporting the substrate between the loading unit and the substrate cleaning unit and between the loading unit and the substrate drying unit.

Exemplary embodiments of the present invention are directed a substrate treating method. In an exemplary embodiment, the substrate treating method may include: preparing a chamber divided into a substrate drying chamber and a high-pressure chamber; providing a substrate into the substrate drying chamber; boosting the substrate drying chamber above a critical pressure of supercritical fluid; supplying the supercritical fluid into the substrate drying chamber to dry the substrate; decompressing the substrate drying chamber to change to an atmospheric state from a state above the critical pressure of the supercritical fluid; and drawing the substrate out of the substrate drying chamber.

DETAILED DESCRIPTION OF PREFERRED EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
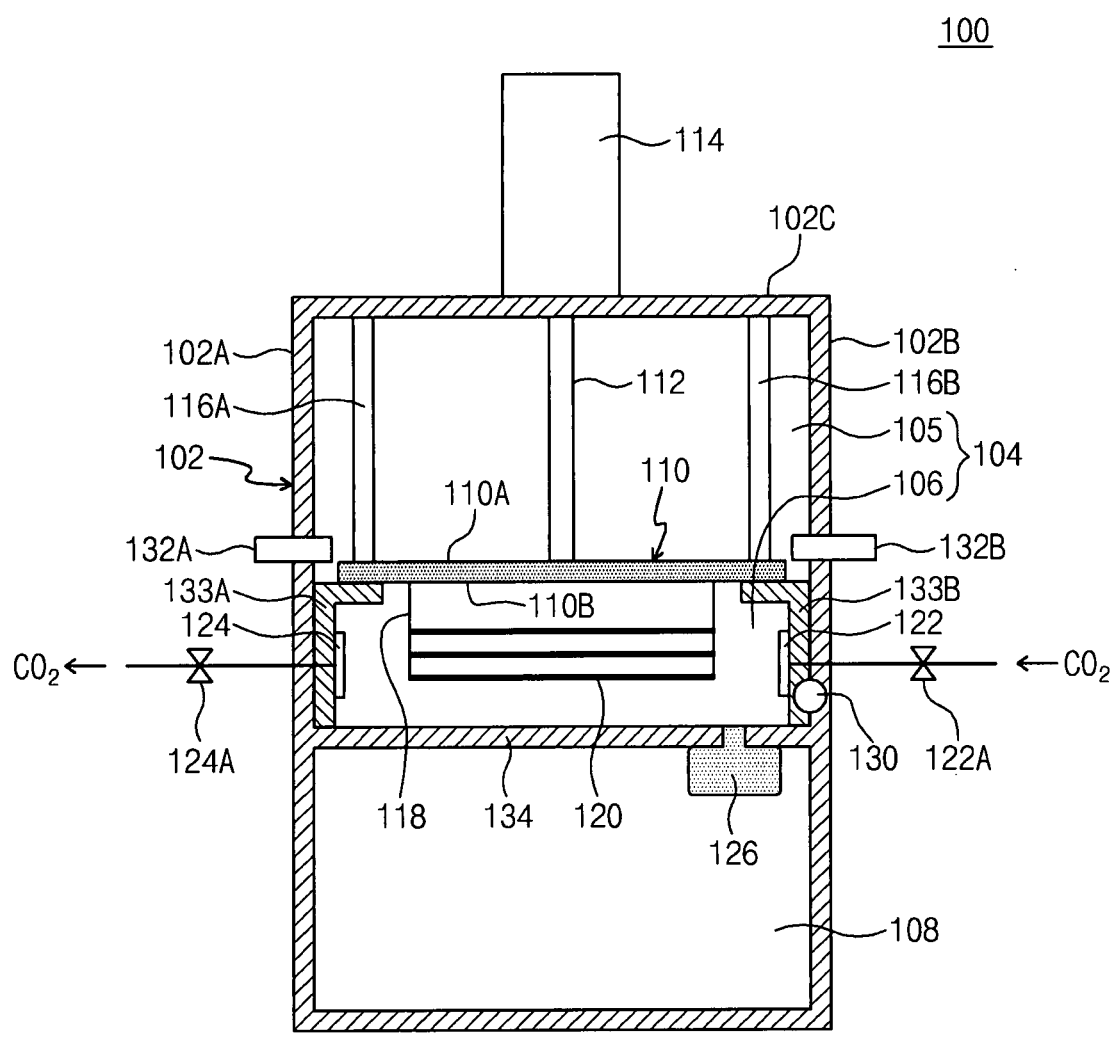
FIG. 1 is a cross-sectional view of a substrate dryer in a substrate treating apparatus according to the present invention.

FIG. 1 is a cross-sectional view of a substrate dryer 100 in a substrate treating apparatus. The substrate dryer 100 includes a chamber 102, which is divided into a process chamber 104 and a high-pressure chamber 108 by a wall 134 extending crosswise inside the chamber 102.

An elevator 114 is disposed on the top side 102C of the chamber 102 and connected to the top surface 110A of a gate 110 by means of a rod 112. The gate 110 is ascended and descended by receiving a power generated from the elevator 114. The ascent and descent of the gate 110 is led by rails 116A and 116B facing each other. The lowermost position of the gate 110 is decided by a stopper 133A disposed in a left sidewall 102A and a stopper 133B disposed in a right sidewall 102B. The gate 110 reaches the lowermost position to divide the process chamber 104 into a substrate transporting chamber 105 and a substrate drying chamber 106.

Safety pins 132A and 132B are provided to the left and right sidewalls 102A and 102B of the chamber 102, respectively. When the gate 110 reaches the lowermost position, the safety pins 132A and 132B travel to the inside of the chamber 102 to lock the gate 110. A substrate support 118 is connected to the bottom surface 110B of the gate 110 to support at least one substrate 120 that is a dry-target object.

A supply nozzle 122 is provided to supply drying fluid to the substrate drying chamber 106, and a drain port 124 is provided to drain the supplied drying fluid. The drying fluid is supplied to the substrate drying chamber 106 through the supply nozzle 122 whose valve 122A is opened, being used in a drying treatment. The supplied drying fluid is drained from the substrate drying chamber 106 through the drain port 124 whose valve 124A is opened. The drying fluid is supercritical fluid.

Figure 2:
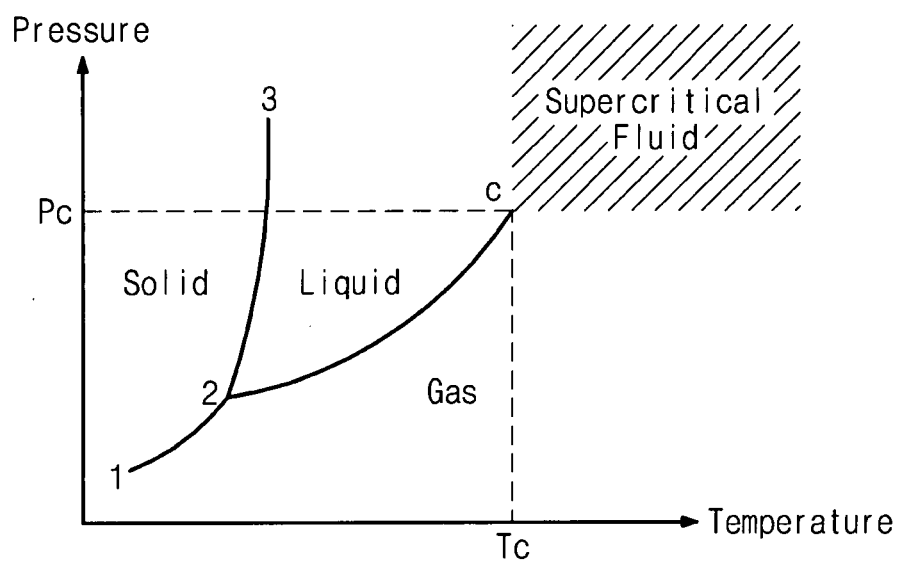
FIG. 2 is a graph illustrating a pressure-temperature (PT) phase diagram of pure fluid in a substrate treating apparatus according to the present invention.

FIG. 2 is a graph illustrating a pressure-temperature (PT) phase diagram of pure fluid in a substrate treating apparatus according to the present invention.

Referring to FIG. 2, a vapor pressure of solid is measured while a temperature of pure fluid rises up to a triple point 2. If a vapor pressure of the pure fluid is measured above the triple point 2, a pressure-temperature (PT) curve including a sublimation curve (1-2 curve) and a vaporization curve (2-C curve) may be drawn. In the graph, a melting curve (2-3 curve) indicates solid-liquid equilibrium. Supercritical fluid means fluid at or above its critical temperature (Tc) and its critical pressure (Pc) and no longer displays the properties of either a gas or a liquid. Thus, supercritical fluid is not liquefied even though a pressure higher than its critical pressure is applied thereto, i.e., exhibits non-condensability. Namely, supercritical fluid has both gaseous properties (e.g., diffusivity and viscosity) and liquid properties (e.g., solubility). In this embodiment, supercritical carbon dioxide ($CO_2$) is adopted as drying fluid. Note that the supercritical carbon dioxide has physical properties as follows: critical temperature 31° C., critical pressure 72.8 atm, viscosity 0.03 cP at a critical section (35° C., 75 atm), surface tension 0 dynes/cm, and density 300 kg/m$^3$.

Returning to FIG. 1, the high-pressure chamber 108 is provided such that the substrate drying chamber 106 changes rapidly to the state corresponding to a critical state of carbon dioxide. A pressure of the high-pressure chamber 108 is set to enable the high-pressure chamber 108 to be maintained at a high-pressure state, at least, above a critical pressure of carbon dioxide. When a fast boosting valve 126 is opened, the pressure of the substrate drying chamber 106 is boosted above the critical pressure of carbon dioxide. While the pressure of the substrate drying chamber 106 is boosted, supercritical fluid is supplied into the substrate drying chamber 106 to perform a dry treatment for the substrate 102.

If the dry treatment is ended in the substrate drying chamber 106, it is necessary that the substrate drying chamber 106 changes from a high-pressure state to an atmospheric state to unload the substrate 120. In this regard, an atmospheric pressure maintain valve 130 is provided to set the substrate drying chamber 106 to the atmospheric pressure. The atmospheric pressure maintain valve 130 is disposed at a sidewall, e.g., a right sidewall 102b of the chamber 102. When the dry treatment is ended in the substrate drying chamber 106, the atmospheric pressure maintain valve 130 is opened to decompress the substrate drying chamber 106 from a high-pressure state to an atmospheric state.

FIGS. 3 through 6 are cross-sectional views for explaining a substrate treating method using a substrate dryer in a substrate treating apparatus according to the present invention.

Figure 3:
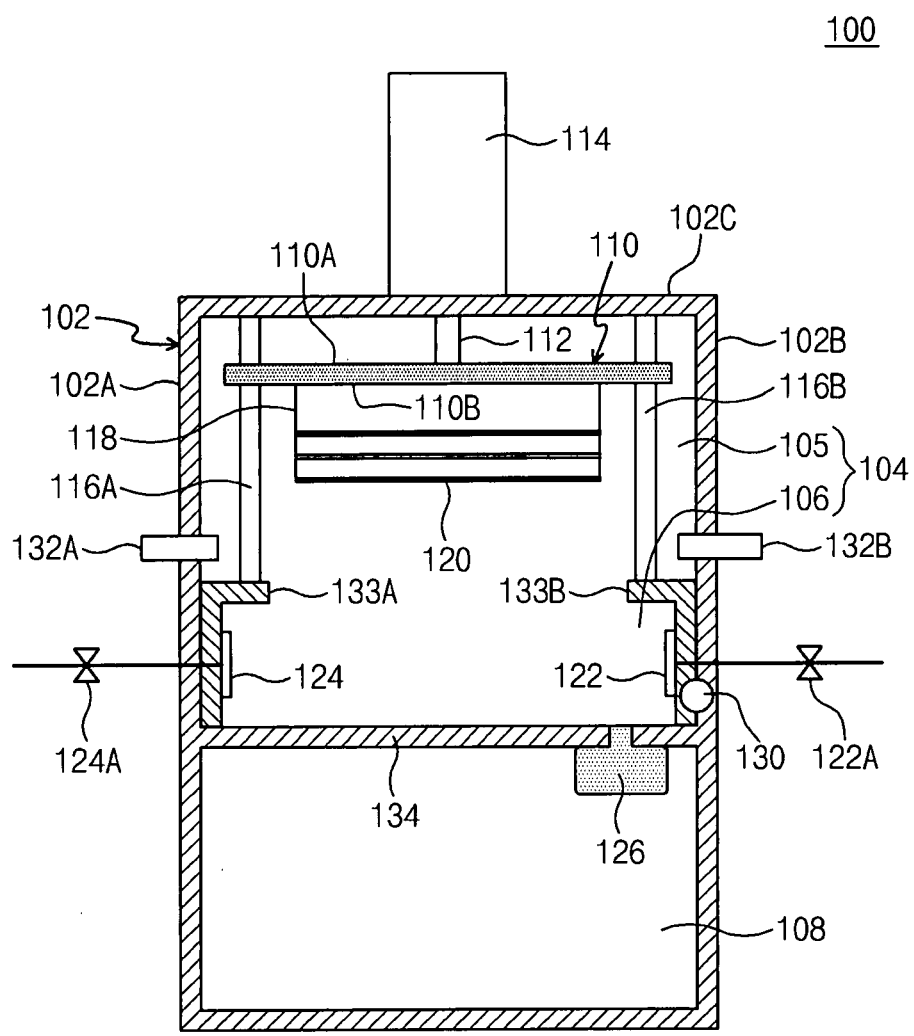
FIGS. 3 through 6 are cross-sectional views for explaining a substrate treating method using a substrate dryer in a substrate treating apparatus according to the present invention.

Referring to FIG. 3, a dry-target object, i.e., a substrate 120 is loaded to a substrate dryer 100. In the loading step, at least one substrate 120 is supported by a substrate support 118 while a gate 110 is ascended. A process chamber 104 is maintained at a high-pressure state such that a substrate drying chamber 106 is set, at least, above a critical pressure (72.8 atm) of carbon dioxide when a fast boosting valve 126 is opened, which will be described later.

Figure 4:
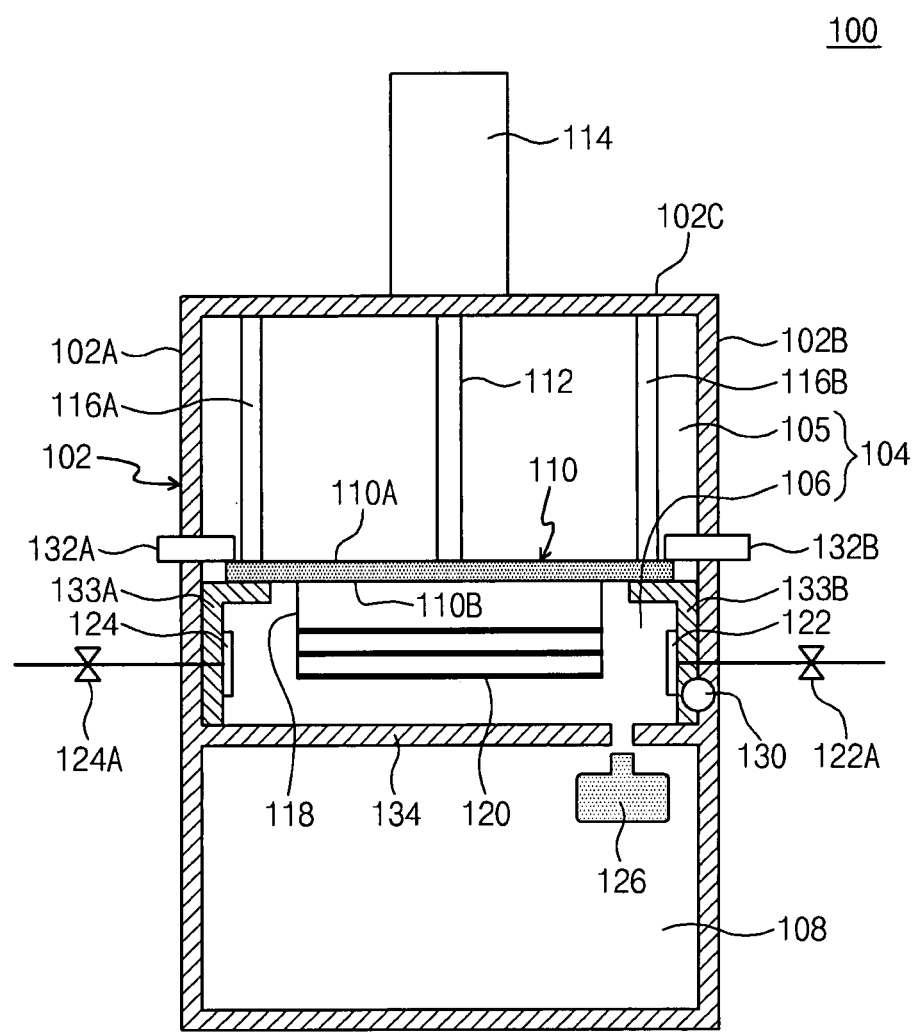

Referring to FIG. 4, while the substrate 120 is supported by the substrate support 118, the gate 110 is descended to seal the substrate drying chamber 106. While the gate 110 is descended, safety pins 132A and 132B are slid inwardly toward the substrate drying chamber 106 to press both edges of the gate 110. Thus, the gate 110 is locked. While the gate 110 is locked, the fast boosting valve 126 is opened to allow the substrate drying chamber 106 to be boosted fast above a critical pressure of carbon dioxide, as previously stated. When the substrate drying chamber 106 is boosted above the critical pressure (Pc) of carbon dioxide, it is heated above a critical temperature (Tc) of the carbon dioxide along a vaporization curve (2-C curve), as illustrated in FIG. 2. The substrate drying chamber 106 is maintained at a supercritical state, e.g., 35° C. and 75 atm.

Figure 5:
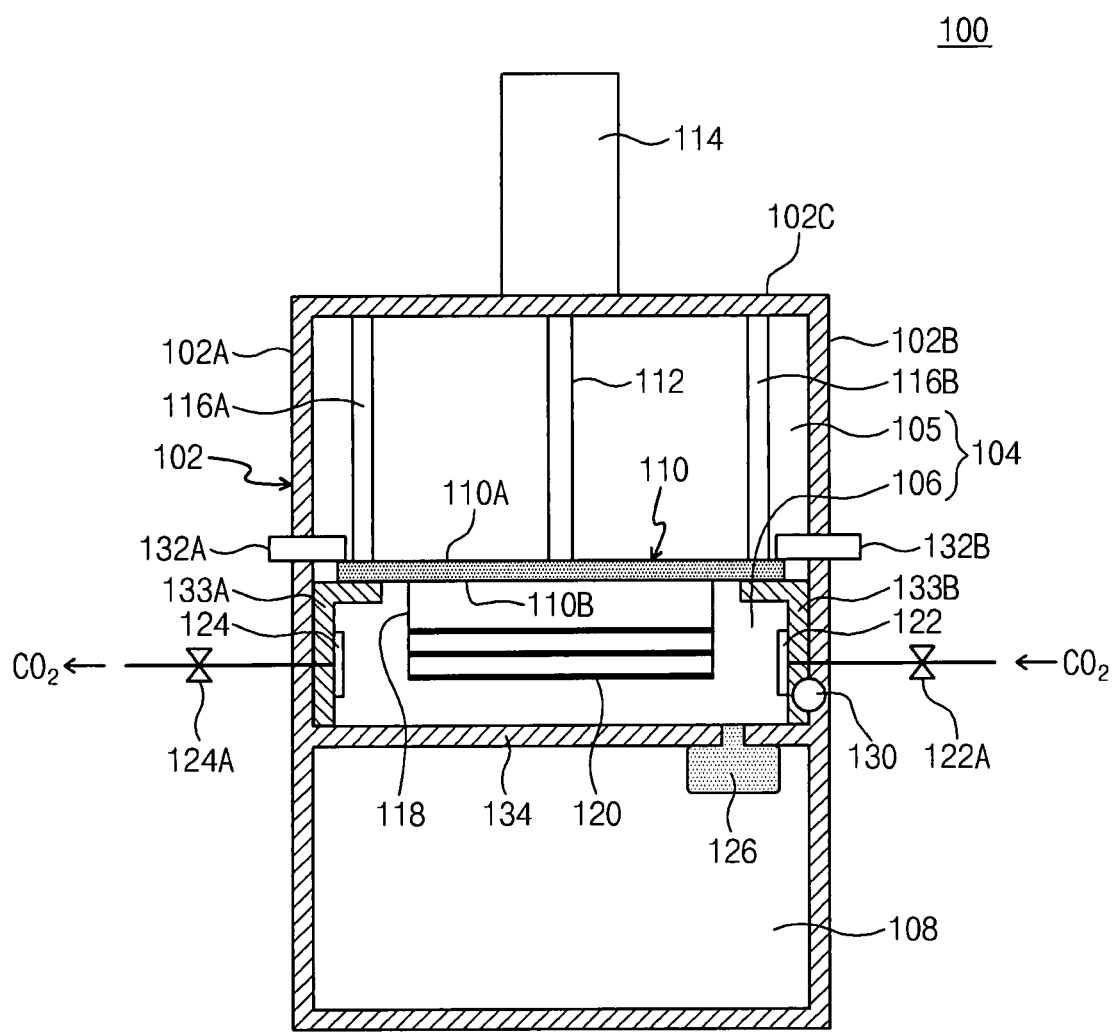

Referring to FIG. 5, if the substrate drying chamber 106 is maintained at the supercritical state above the critical pressure (Pc) of carbon dioxide, a fast boosting valve 126 is closed and a valve 122A is opened to supply supercritical carbon dioxide into the substrate drying chamber 106 through a supply nozzle 122. Thus, a dry treatment is performed for the substrate 120 inside the substrate drying chamber 106 at a high-pressure state. After the substrate drying chamber 106 is maintained at the supercritical state for a predetermined time to perform a dry treatment for the substrate 120, the supercritical carbon dioxide is drained through a drain port 124. Alternatively, a dry treatment may be performed for the substrate 120 while the substrate drying chamber 106 is maintained at the supercritical state and the supercritical carbon dioxide is supplied and drained.

Figure 6:
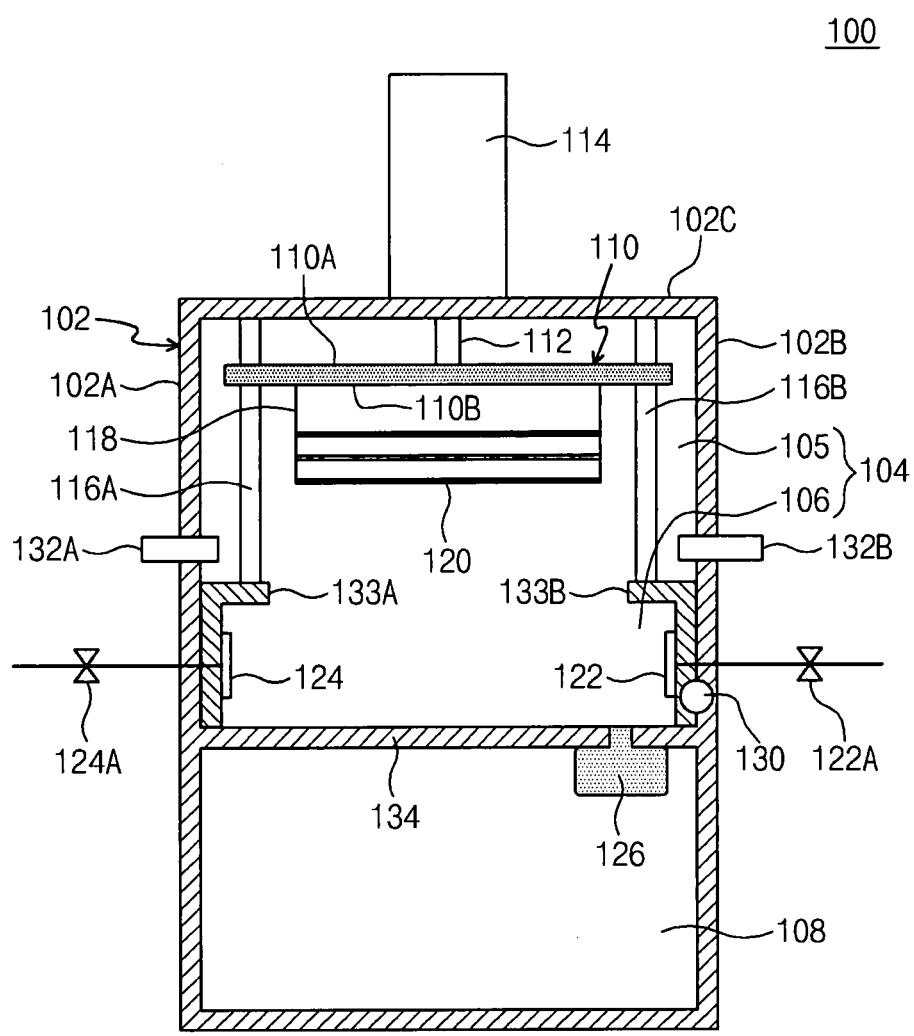

Referring to FIG. 6, an atmospheric pressure maintain valve 130 is opened to decompress the substrate drying chamber 106 to the atmospheric state. If the substrate drying chamber 106 is decompressed to the atmospheric state from a critical pressure, the safety pins 132A and 132B are opened to ascend the gate 110. The substrate 120 is unloaded from the substrate support 118. The unloaded substrate 120 is transported to the outside from a substrate transporting chamber 105.

Figure 7:
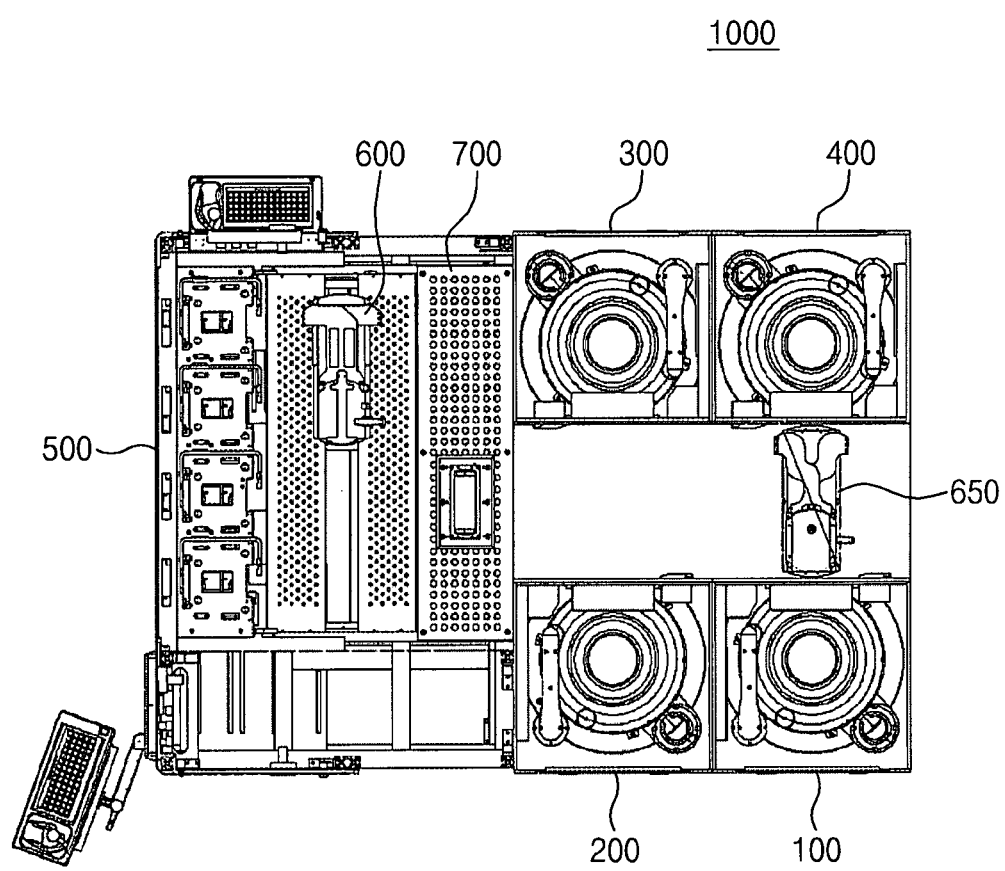
FIG. 7 is a top plan view of a substrate treating apparatus according to the present invention.

The above-described substrate dryer 100 may be a part of a single-wafer treating apparatus 1000 illustrated in FIG. 7.

Referring to FIG. 7, a substrate (see 120 in FIGS. 3 through 6) is loaded to the apparatus 1000 at a substrate load/unload unit 500. After temporarily staying at a buffer unit 700 by means of a substrate transport robot 600, the loaded substrate 120 is transported to treating units 100, 200, 300, and 400 to be treated there. At least one (200) of the treating units 200-400 includes a cleaning unit where the substrate 120 is cleaned. The cleaned substrate 120 is transported to the buffer unit 700 by means of the substrate transport robot 600. Afterwards, the substrate 120 is transported to the substrate load/unload unit 500 to be unloaded. It will be understood that the foregoing substrate dryer 100 may be applied to not only the single-wafer treating apparatus 1000 but also batch-wafer treating apparatuses.

According to the present invention, a substrate is effectively dried, without watermarks, using supercritical fluid having a cleaning force of liquid and viscosity of gas. Thus, a substrate treatment is stably performed to enhance a production and a yield. Moreover, a substrate dryer is compatibly applied to not only single-wafer treating apparatuses but also batch-wafer treating apparatuses.

Although the present invention has been described in connection with the embodiment of the present invention illustrated in the accompanying drawings, it is not limited thereto.

It will be apparent to those skilled in the art that various substitutions, modifications and changes may be made without departing from the scope and spirit of the invention.

What is claimed is:

1. A substrate dryer comprising:
   a process chamber and a high-pressure chamber separated by a wall;
   wherein the process chamber comprises:
      a substrate transporting chamber for loading and carrying a substrate;
      a substrate drying chamber that is sealable with respect to the substrate transporting chamber via a gate for providing a sealed space disposed between the substrate transporting chamber and the wall in which to dry the substrate; and
      a nozzle at least partially disposed within the substrate drying chamber for supplying a supercritical fluid to the substrate drying chamber for drying the substrate;
   wherein the high-pressure chamber is maintained at a high-pressure state, which is at least above a critical pressure of the supercritical fluid, the high-pressure chamber being configured to increase a pressure state of the substrate drying chamber to correspond to the high-pressure state upon opening a first valve disposed in the wall between the process chamber and the high-pressure chamber, thereby maintaining the supercritical fluid above the critical pressure.

2. The substrate dryer of claim 1, wherein the gate is elevatable for isolating substrate transporting chamber and the substrate drying chamber.

3. The substrate dryer of claim 2, wherein the gate is coupled with a substrate support configured to load the substrate.

4. The substrate dryer of claim 2, wherein the gate is coupled with an elevator unit configured to elevate the gate by means of a rod.

5. The substrate dryer of claim 4, wherein the elevator unit comprises:
   an elevator coupled with the gate;
   a stopper provided for setting the lowermost position of the gate;
   a safety pin provided for locking the gate; and
   a rail provided for guiding the elevation of the gate.

6. The substrate dryer of claim 1, further comprising:
   a second valve disposed at the substrate drying chamber and configured for decompressing the substrate drying chamber to change to an atmospheric state from the supercritical state.

7. The substrate dryer of claim 1, wherein the high-pressure chamber is provided below the process chamber.

8. The substrate dryer of claim 1, wherein the supercritical fluid comprises supercritical carbon dioxide.

* * * * *